(12) United States Patent
Cho et al.

(10) Patent No.: US 7,629,213 B2
(45) Date of Patent: Dec. 8, 2009

(54) METHOD OF MANUFACTURING FLASH MEMORY DEVICE WITH VOID BETWEEN GATE PATTERNS

(75) Inventors: Whee Won Cho, Chungcheongbuk-do (KR); Jung Geun Kim, Seoul (KR); Seong Hwan Myung, Kyeongki-do (KR); Cheol Mo Jeong, Kyeongki-do (KR)

(73) Assignee: Hynix Semiconductor Inc., Icheon-shi (KR)

( * ) Notice: Subject to any disclaimer, the term of this patent is extended or adjusted under 35 U.S.C. 154(b) by 402 days.

(21) Appl. No.: 11/647,628

(22) Filed: Dec. 29, 2006

(65) Prior Publication Data

US 2008/0003724 A1    Jan. 3, 2008

(30) Foreign Application Priority Data

Jun. 30, 2006    (KR) .................. 10-2006-0060493
Dec. 15, 2006    (KR) .................. 10-2006-0128669

(51) Int. Cl.
*H01L 21/8238* (2006.01)

(52) U.S. Cl. .............. 438/201; 438/211; 438/257; 438/593; 438/FOR. 203; 257/314; 257/315; 257/E21.179; 257/E21.422; 257/E21.68

(58) Field of Classification Search .............. 438/201, 438/211, 257, 593, FOR. 203; 257/314, 257/315, E21.179, E21.422, E21.68
See application file for complete search history.

(56) References Cited

U.S. PATENT DOCUMENTS

2006/0105525 A1 *  5/2006  Kim et al. ................. 438/257
2007/0164343 A1 *  7/2007  Matsui et al. ............. 257/314

FOREIGN PATENT DOCUMENTS

| JP | 2002-043618 | 2/2002 |
| KR | 10-2002-0011500 | 2/2002 |
| KR | 10-2002-0064589 | 8/2002 |
| KR | 10-2004-0052359 | 6/2004 |

* cited by examiner

*Primary Examiner*—Thanh V Pham
(74) *Attorney, Agent, or Firm*—Marshall, Gerstein & Borun LLP

(57) ABSTRACT

A method of manufacturing a flash memory device includes the steps of forming gate patterns for cells and gate patterns for select transistors over a semiconductor substrate, forming a buffer insulating layer on the resulting surface including the gate patterns, forming an insulating layer to form void in spaces between the gate patterns for cells, forming a nitride layer on the insulating layer, and forming a spacer on one side of each of the gate patterns for select transistors by a spacer etch process.

8 Claims, 3 Drawing Sheets

METHOD OF MANUFACTURING FLASH MEMORY DEVICE WITH VOID BETWEEN GATE PATTERNS

BACKGROUND OF THE INVENTION

1. Field of the Invention

The invention relates to a method of manufacturing a flash memory device.

2. Related Technology

In flash memory devices, space between gate patterns for cells is narrowed as the level of integration increases. Thus, interference capacitance between the gate patterns for cells increases, and cell Vt shift becomes profound by the influence of charging from neighboring cells.

SUMMARY OF THE INVENTION

The invention is directed to a method of manufacturing a flash memory device, wherein electrical characteristics of devices can be improved and the level of integration of devices increased by decreasing interference capacitance between gate patterns for cells.

In one embodiment, a method of manufacturing a flash memory device includes the steps of forming gate patterns for cells and gate patterns for select transistors over a semiconductor substrate, forming a buffer insulating layer on the resulting surface including the gate patterns, forming an insulating layer to form void in spaces between the gate patterns for cells, forming a nitride layer on the insulating layer, and forming a spacer on one side of each of the gate patterns for select transistors by a spacer etch process.

In another embodiment, a method of manufacturing a flash memory device includes the steps of forming gate patterns for cells and gate patterns for select transistors over a semiconductor substrate, forming a buffer insulating layer on the resulting surface including the gate patterns, forming an insulating layer to form void in spaces between the gate patterns for cells, etching the insulating layer such that a portion of the insulating layer between the gate patterns for cells remains, and forming a spacer on one side of each of the gate patterns for select transistors.

DESCRIPTION OF SPECIFIC EMBODIMENTS

Specific embodiments according to the invention are described below with reference to the accompanying drawings.

FIGS. 1A to 1E are cross-sectional views illustrating a method of manufacturing a flash memory device according to a first embodiment of the invention.

Figure 1A:
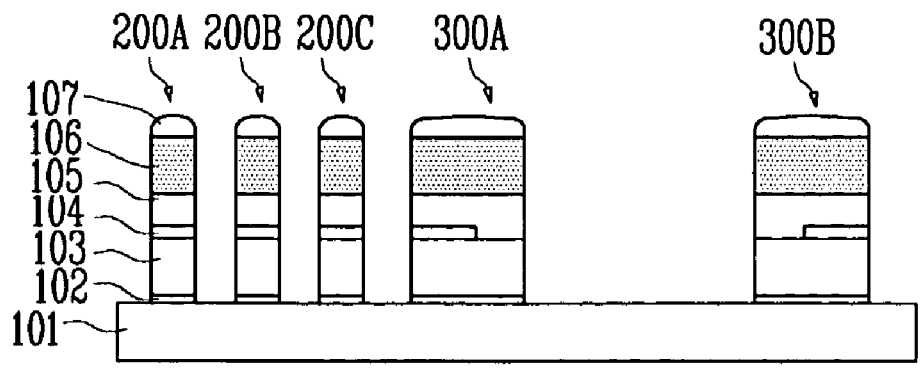
FIGS. 1A to 1E are cross-sectional views illustrating a method of manufacturing a flash memory device according to a first embodiment of the invention.

Referring to FIG. 1A, a tunnel insulating layer 102, a first polysilicon layer 103, a dielectric layer 104, a second polysilicon layer 105, a conductive layer 106 and a hard mask layer 107 are sequentially laminated over a semiconductor substrate 101. Gate patterns 200A, 200B, and 200C for cells, and gate patterns 300A and 300B for select transistors are formed by an etch process using the gate mask. The dielectric layer 104 is preferably formed from Oxide/Nitride/Oxide (ONO) layers. The conductive layer 106 is formed from tungsten silicide ($WS_{ix}$).

Figure 1B:
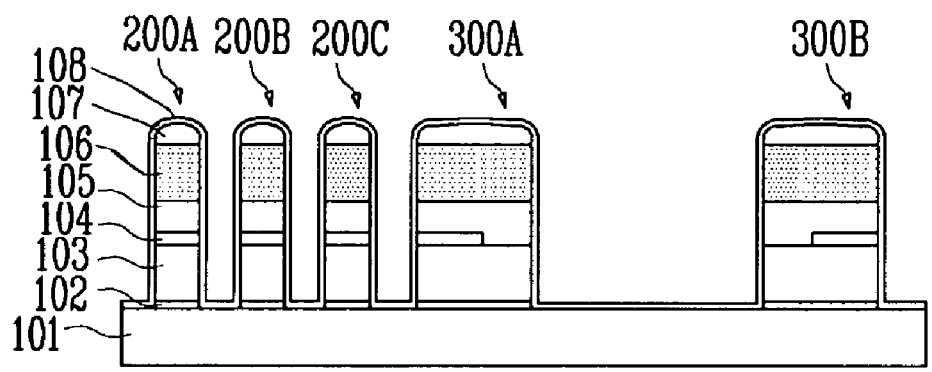

Referring to FIG. 1B, a buffer insulating layer 108 is formed on the entire surface including the gate patterns 200A, 200B, 200C, 300A, and 300B. The buffer insulating layer 108 is preferably formed from an oxide.

Figure 1C:
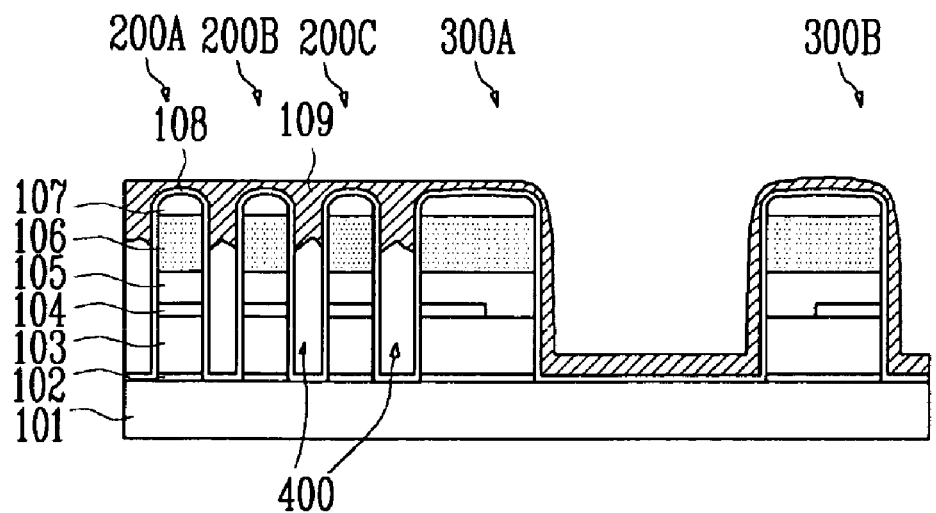

Referring to FIG. 1C, an insulating layer 109 having a poor gap-fill characteristic is formed on the buffer insulating layer 108. Accordingly, a void 400 is formed in spaces between the gate patterns 200A, 200B, and 200C for cells having a narrow space, and between the outermost gate pattern 200C for cell and a neighboring gate pattern 300A for select transistor.

The insulating layer 109 has a poor gap-fill characteristic. Thus, overhangs occur at the entrance portions having a narrow space as the insulating material is deposited. Consequently, the overhangs are brought in contact with each other to clog the entrance, thus generating the void 400. The insulating layer 109 is preferably formed from a High Density Plasma (HDP) oxide layer or a Tetra Ethyl Ortho Silicate (TEOS) oxide layer. The amount of O2 present in the HDP oxide layer is preferably at least 1.5 times greater than that of $SiH_4$ in order to facilitate the formation of the void 400. Alternatively, the void 400 can be formed using the HDP oxide layer by performing a sputtering process at least once in the middle of the process of depositing the HDP oxide layer so that the entrances can be clogged fast. The HDP oxide layer is preferably formed in a plasma process and is therefore formed in a state where a wafer is maintained in the range of 200° C. to 500° C. in order to minimize damage due to the plasma of the tunnel insulating layer 102 and the dielectric layer 104.

Figure 1D:
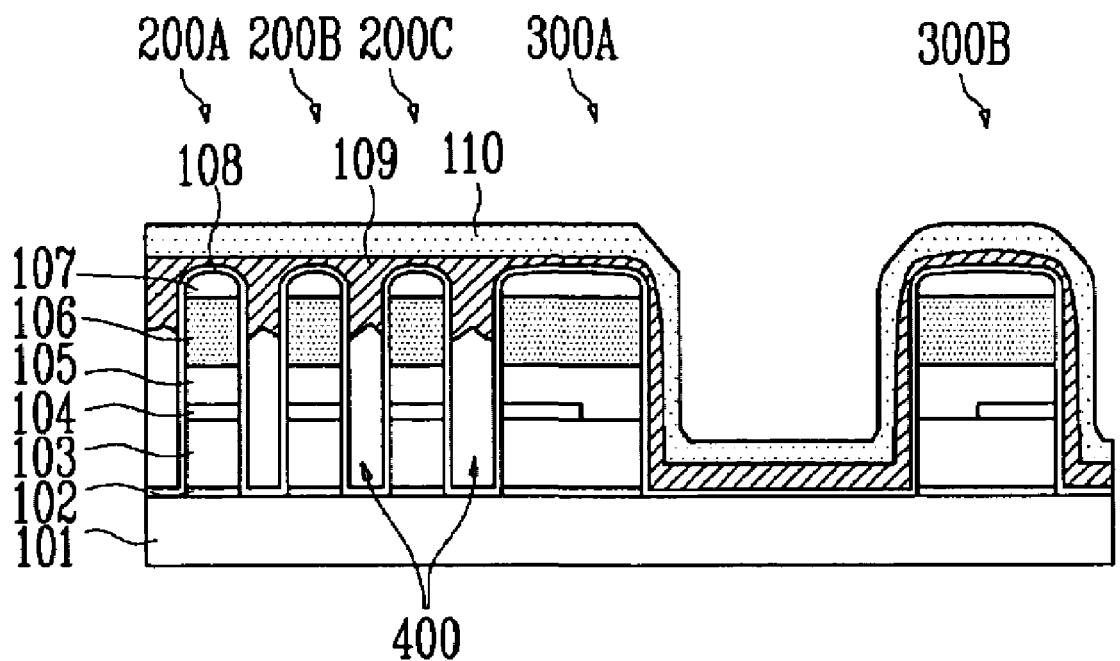

Referring to FIG. 1D, a nitride layer 110 is formed on the insulating layer 109. Before the nitride layer 110 is formed, a process of polishing the surface of the insulating layer 109 may be performed.

Figure 1E:
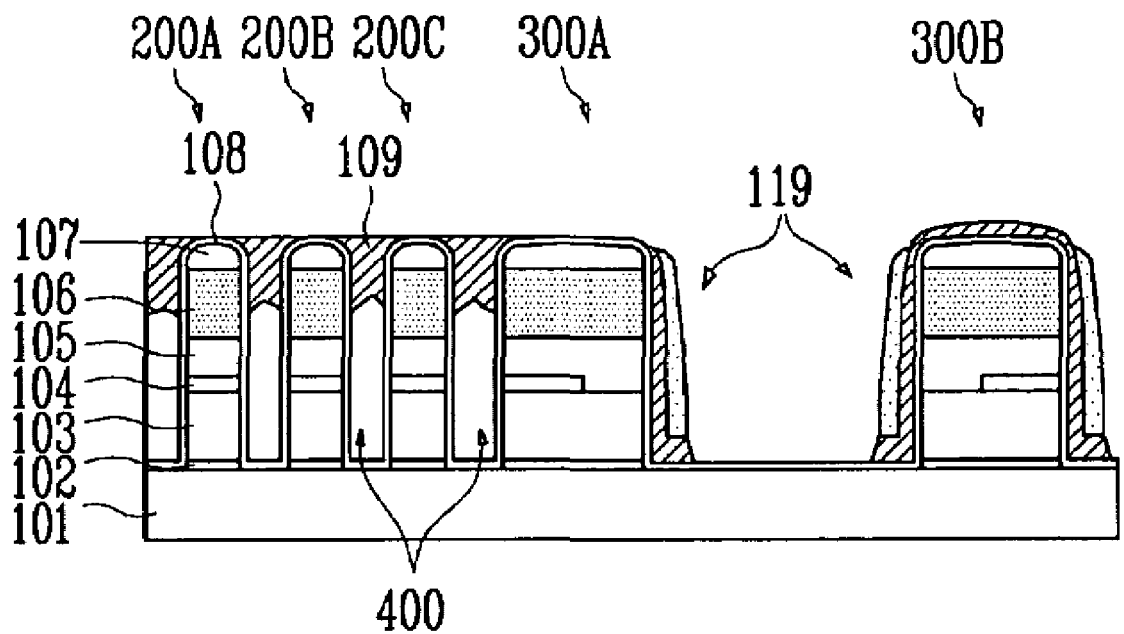

Referring to FIG. 1E, the nitride layer 110 is etched by a spacer etch process. The insulating layer 109 existing between the gate patterns 300A and 300B for select transistor, which have a relatively wide space, is removed, so that a dual spacer 119 having the insulating layer 109 and the nitride layer 110 is formed on one side of each of the gate patterns 300A and 300B for select transistor.

Figure 2A:
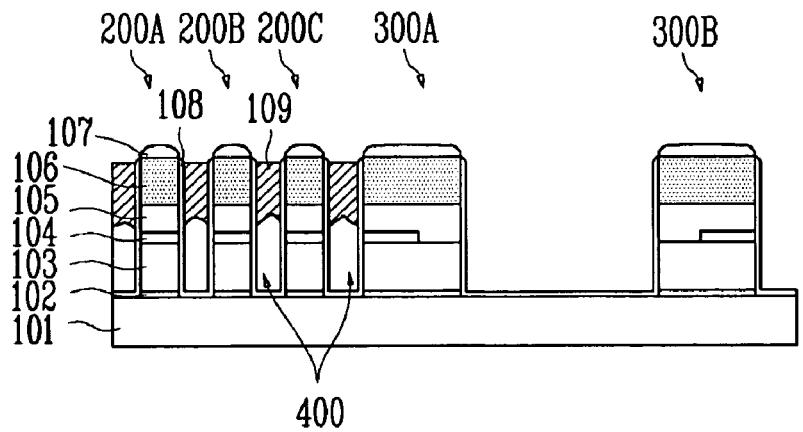
FIGS. 2A to 2C are cross-sectional views illustrating a method of manufacturing a flash memory device according to a second embodiment of the invention.
Figure 2B:
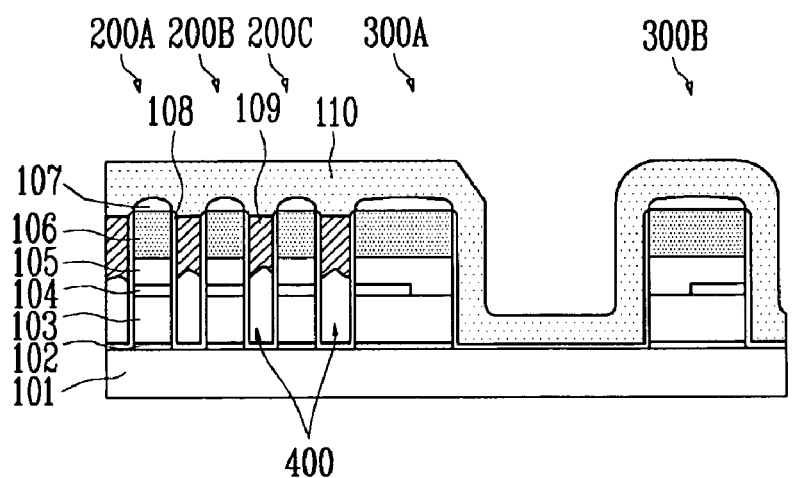
Figure 2C:
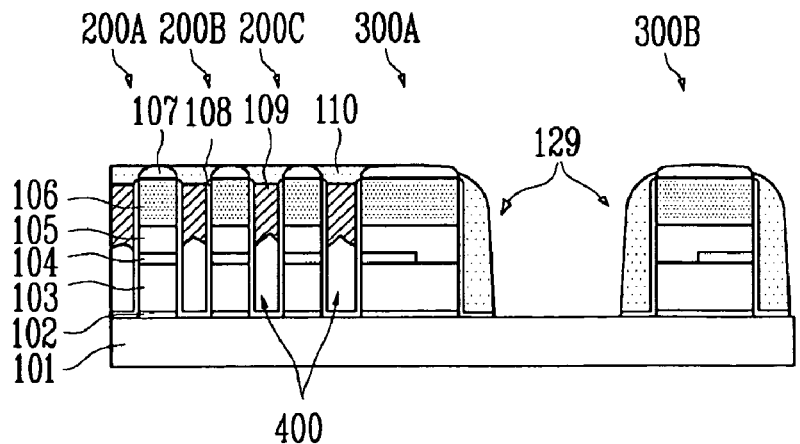

FIGS. 2A to 2C are cross-sectional views illustrating a method of manufacturing a flash memory device according to a second embodiment of the invention.

Referring to FIG. 2A, after the process described with reference to FIGS. 1A to 1C is completed, the insulating layer 109 is etched using an etch target through which the insulating layer 109 between the gate patterns 300A and 300B for select transistors is removed. Thus, although the insulating layer 109 between the gate patterns 300A and 300B for select transistor are fully removed, the insulating layer 109 between the gate patterns 200A, 200B, and 200C for cells partially remains. This is because the insulating layer 109 formed between the gate patterns 200A, 200B, and 200C for cells is thicker than the insulating layer 109 formed between the gate patterns 300A and 300B for select transistors. The etch process of the insulating layer 109 is preferably formed by using either a dry etch method or a wet etch method. When considering etch process conditions, etc, it is preferred that the wet etch method is used as the etch process of the insulating layer 109.

Referring to FIG. 2B, a nitride layer 110 is formed on the resulting surface.

Referring to FIG. 2C, the nitride layer 110 is etched using a spacer etch process, so that a spacer 129 having the nitride layer 110 is formed on one side of each of the gate patterns 300A and 300B for select transistor. The thickness of the spacer 129 may be decided by controlling a deposition thickness of the nitride layer 110, spacer etch process conditions, and/or the like. This is advantageous in that the spacer 129 can be formed thickly in order to prevent etch damage to a top end of a source line or a drain line at the time of a subsequent self-aligned contact process of forming a source contact or a drain contact.

As described above, in accordance with a method of manufacturing a flash memory device according to the invention, a void is formed between gate patterns for cells. Therefore, interference capacitance between gate patterns for cells can be decreased, thus improving cell Vt shift incurred by charging from neighboring. Accordingly, the level of integration and high function of a flash memory device can be realized.

Furthermore, according to the present invention, a relatively thick spacer formed on one side of each of the gate patterns for select transistors can be formed. It is therefore possible to prevent etch damage to a drain line and a source line at the time of a self-aligned contact process.

The described embodiments of the invention are illustrative and not limiting. Various alternatives and equivalents are possible. Other additions, subtractions, or modifications of the disclosure are intended to fall within the scope of the appended claims.

What is claimed is:

1. A method of manufacturing a flash memory device, comprising the steps of:
    forming gate patterns for cells and gate patterns for select transistors over a semiconductor substrate;
    forming a buffer insulating layer on the resulting surface including the gate patterns;
    forming an insulating layer to form void in spaces between the gate patterns for cells;
    forming a nitride layer on the insulating layer; and
    forming a spacer on one side of each of the gate patterns for select transistors by a spacer etch process.

2. The method of claim 1, comprising forming the buffer insulating layer from oxide.

3. The method of claim 1, comprising forming the insulating layer using material having a poor gap-fill characteristic.

4. The method of claim 3, wherein the insulating layer comprises a High Density Plasma (HDP) oxide layer or a Tetra Ethyl Ortho Silicate (TEOS) oxide layer.

5. The method of claim 4, wherein an amount of $O_2$ present in the HDP oxide layer is at least 1.5 times greater than that of $SiH_4$.

6. The method of claim 4, comprising forming the HDP oxide layer by performing, at least once, a sputtering process in the middle of a deposition process of the HDP oxide layer.

7. The method of claim 4, comprising forming the HDP oxide layer with a wafer being maintained in a temperature range of 200° C. to 500° C.

8. The method of claim 1, comprising forming the spacer by etching the nitride layer using the spacer etch process and then removing the insulating layer existing between the gate patterns for select transistors.

* * * * *